(12) United States Patent
Stirton

(10) Patent No.: US 6,859,746 B1
(45) Date of Patent: Feb. 22, 2005

(54) METHODS OF USING ADAPTIVE SAMPLING TECHNIQUES BASED UPON CATEGORIZATION OF PROCESS VARIATIONS, AND SYSTEM FOR PERFORMING SAME

(75) Inventor: James Broc Stirton, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 13 days.

(21) Appl. No.: 10/427,621

(22) Filed: May 1, 2003

(51) Int. Cl.$^7$ .............................................. G06F 19/00
(52) U.S. Cl. .......................................... 702/83; 702/81
(58) Field of Search .................... 73/865.8; 438/14, 438/17; 700/1, 90, 95, 108, 109, 121; 702/33, 57, 81, 83, 84, 85, 127, 182, 184, 121

(56) References Cited

U.S. PATENT DOCUMENTS

| | | | |
|---|---|---|---|
| 5,867,276 A | 2/1999 | McNeil et al. .............. 356/445 |
| 5,877,860 A | 3/1999 | Borden ....................... 356/376 |
| 5,880,838 A | 3/1999 | Marx et al. .................. 356/351 |
| 5,956,692 A * | 9/1999 | Foley ............................ 705/7 |
| 6,051,348 A | 4/2000 | Marinaro et al. ............ 430/30 |
| 6,055,463 A * | 4/2000 | Cheong et al. ............. 700/223 |
| 6,081,334 A | 6/2000 | Grimbergen et al. ....... 356/357 |
| 6,115,643 A * | 9/2000 | Stine et al. ................. 700/110 |
| 6,141,107 A | 10/2000 | Nishi et al. ................. 356/401 |
| 6,223,098 B1 * | 4/2001 | Cheong et al. ............. 700/223 |
| 6,245,584 B1 | 6/2001 | Marinaro et al. ............. 438/14 |
| 6,319,884 B2 | 11/2001 | Leduc et al. ................ 510/175 |
| 6,383,888 B1 | 5/2002 | Stirton ........................ 438/401 |
| 6,423,977 B1 | 7/2002 | Hayasaki et al. ....... 250/559.19 |
| 6,433,878 B1 | 8/2002 | Niu et al. .................... 356/603 |
| 6,445,969 B1 * | 9/2002 | Kenney et al. ............. 700/108 |
| 6,479,200 B1 | 11/2002 | Stirton ........................ 430/30 |
| 6,529,282 B1 | 3/2003 | Stirton et al. ............... 356/630 |
| 6,597,447 B1 * | 7/2003 | Stirton et al. ............. 356/237.2 |
| 6,643,557 B1 * | 11/2003 | Miller et al. ................ 700/110 |
| 6,650,955 B1 * | 11/2003 | Sonderman et al. ........ 700/108 |
| 6,721,939 B2 * | 4/2004 | Wang et al. .................. 716/21 |
| 6,742,168 B1 * | 5/2004 | Nariman ......................... 716/4 |
| 6,766,214 B1 * | 7/2004 | Wang et al. ................ 700/121 |
| 2002/0135781 A1 | 9/2002 | Singh et al. ................ 356/601 |
| 2003/0204348 A1 * | 10/2003 | Suzuki et al. ................ 702/83 |
| 2004/0121495 A1 * | 6/2004 | Sonderman et al. .......... 438/14 |

OTHER PUBLICATIONS

Kuo, W; Akella, R; Fletcher, D; "Adaptive Sampling for Effective Multi–Layer Defect Monitoring"; IEEE International Symposium on Semiconductor Manufacturing; Oct. 6–8, 1997; pp D1–D4.*

(List continued on next page.)

*Primary Examiner*—Bryan Bui
*Assistant Examiner*—Douglas N Washburn
(74) *Attorney, Agent, or Firm*—Williams, Morgan & Amerson

(57) ABSTRACT

Methods of using adaptive sampling techniques based upon categorization of process variations, and a system for performing same are disclosed. In one illustrative embodiment, the method comprises acquiring metrology data regarding at least one process operation performed on a plurality of substrates in accordance with an initial metrology sampling plan, providing the acquired metrology dam to a controller that identifies process variations in the at least one process operation based upon the acquired metrology data and further identifies a plurality of categories of the process variations. The method further comprises creating, using the controller, a modified metrology sampling plan based upon a relative weighing of the identified categories of the process variations, wherein the modified metrology sampling plan differs from the initial metrology sampling plan in at least one aspect, and acquiring metrology data from at least one subsequently processed wafer in accordance with the modified neology sampling plan.

24 Claims, 4 Drawing Sheets

OTHER PUBLICATIONS

U.S. Appl. No. 09/827,453, entitled "Method of Controlling Stepper Process Parameters Based Upon Optical Properties of Incoming Process Layers, and System for Accomplishing Same," filed Apr. 06, 2001.

U.S. Appl. No. 10/005,486, entitled "Method of Using Scatterometry Measurements to Control Stepper Process Parameters," filed Nov. 08, 2001.

U.S. Appl. No. 10/084,987, entitled "Method of Using High Yielding Spectra Scatterometry Measurments to Control Semiconductor Manufacturing Processes, and Sytsems for Accomplishing Same," filed Feb. 28, 2002.

U.S. Appl. No. 10/404,026, entitled "Methods of Using Adaptive Sampling Techniques to Quantify Tool Performance, and System for Performing Same," filed Apr. 03, 2003.

U.S. Appl. No. 10/427,620, entitled "Method and Apparatus for Filtering Metrology Data Based on Collection Purpose," filed May 01, 2003.

* cited by examiner

METHODS OF USING ADAPTIVE SAMPLING TECHNIQUES BASED UPON CATEGORIZATION OF PROCESS VARIATIONS, AND SYSTEM FOR PERFORMING SAME

BACKGROUND OF THE INVENTION

1. Field of the Invention

This invention relates generally to semiconductor fabrication technology, and, more particularly, to methods of using adaptive sampling techniques based upon categorization of process variations, and a system for performing same.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors.

By way of background, an illustrative field effect transistor 10, as shown in FIG. 1, may be formed above a surface 15 of a semiconducting substrate or wafer 11 comprised of doped-silicon. The substrate 11 may be doped with either N-type or P-type dopant materials. The transistor 10 may have a doped polycrystalline silicon (polysilicon) gate electrode 14 formed above a gate insulation layer 16. The gate electrode 14 and the gate insulation layer 16 may be separated from doped source/drain regions 22 of the transistor 10 by a dielectric sidewall spacer 20. The source/drain regions 22 for the transistor 10 may be formed by performing one or more ion implantation processes to introduce dopant atoms, e.g., arsenic or phosphorous for NMOS devices, boron for PMOS devices, into the substrate 11. Shallow trench isolation regions 18 may be provided to isolate the transistor 10 electrically from neighboring semiconductor devices, such as other transistors (not shown). Additionally, although not depicted in FIG. 1, a typical integrated circuit device is comprised of a plurality of conductive interconnections, such as conductive lines and conductive contacts or vias, positioned in multiple layers of insulating material formed above the substrate. These conductive interconnections allow electrical signals to propagate between the transistors formed above the substrate.

The gate electrode 14 has a critical dimension 12, i.e., the width of the gate electrode 14, that approximately corresponds to the channel length 13 of the device when the transistor 10 is operational. Of course, the critical dimension 12 of the gate electrode 14 is but one example of a feature that must be formed very accurately in modern semiconductor manufacturing operations. Other examples include, but are not limited to, conductive lines, openings in insulating layers to allow subsequent formation of a conductive interconnection, i.e., a conductive line or contact, therein, etc.

In the process of forming integrated circuit devices, millions of transistors, such as the illustrative transistor 10 depicted in FIG. 1, are formed above a semiconducting substrate. In general, semiconductor manufacturing operations involve, among other things, the formation of layers of various materials, e.g., polysilicon, insulating materials, etc., and the selective removal of portions of those layers by performing known photolithographic and etching techniques. These processes are continued until such time as the integrated circuit device is complete. Other processes are also involved, such as ion implantation and various heating processes.

During the course of fabricating such integrated circuit devices, a variety of features, e.g., gate electrodes, conductive lines, openings in layers of insulating material, etc., are formed to very precisely controlled dimensions. Such dimensions are sometimes referred to to as the critical dimension (CD) of the feature. It is very important in modern semiconductor processing that features be formed as accurately as possible due to the reduced size of those features in such modern devices. For example, gate electrodes may now be patterned to a width 12 that is approximately 120 nm (1200 Å), and further reductions are planned in the future. As stated previously, the width 12 of the gate electrode 14 corresponds approximately the channel length 13 of the transistor 10 when it is operational. Thus, even slight variations in the actual dimension of the feature as fabricated may adversely affect device performance. Thus, there is a great desire for methods that may be used to accurately, reliably and repeatedly form features to their desired critical dimension, i.e., to form the gate electrode 14 to its desired critical dimension 12.

In some cases, it is also desirable that the thickness of various process layers be very tightly controlled. Such layers may be formed by a variety of deposition processes, e.g., plasma enhanced chemical vapor deposition (PECVD), chemical vapor deposition (CVD), sputter deposition, etc. Thermal growth processes may also be employed in manufacturing process layers. As one specific example, the thickness of the gate insulation layer 16 for the transistor 10 must be very tightly controlled to insure that the completed device meets strict performance requirements. As another example, the thickness of a barrier metal layer formed in an opening in an insulating layer must be precisely controlled to insure substantial coverage of the interior surfaces of the opening. Moreover, the thickness of the barrier metal layer needs to be relatively uniform to insure that it performs its intended function and to insure that it does not create additional problems for processes that are to be subsequently performed, e.g., filling the opening with a conductive material such as copper. Accurate placement of and implant regions of the appropriate depth and dopant concentration levels is also an important aspect of manufacturing modern integrated circuit devices.

Manufacturers of high performance integrated circuit products expend great effort in attempting to insure that the products meet the very stringent manufacturing tolerances. More particularly, a vast amount of metrology data is typically acquired at various points during the manufacture of the products. Typically, manufacturers often establish a standard metrology sampling protocol or pattern to acquire metrology data about the devices as they are being manufactured. For example, a typical sampling plan may involve collecting metrology data on every tenth lot of substrates that are processed. Within each of the sampled lots, a set number of substrates, e.g., four, may be subjected to metrology testing. Standard metrology sampling plans are also applied to each sampled wafer. For example, thickness measurements of a deposited layer of material may be taken at a preselected standard number of locations. The pattern of the metrology sites in such a standard sampling protocol are selected so as to attempt to obtain information reflective of the entire deposited layer.

Metrology data is also collected with respect to various aspects of photolithography processes performed in manufacturing semiconductor devices. A stepper exposure process typically involves exposing a layer of photoresist to a light source to establish a pattern in the layer of photoresist. Such stepper exposure processes are performed on a flash-by-flash basis as the substrate is moved, or stepped, relative to the light source. Each flash may expose an area, i.e., an exposure field, that covers a plurality of die, e.g., four die (a 2×2 exposure field). The number of exposure fields per substrate may vary depending on the size of the substrate, the number of die, and the size of the exposure field. For an illustrative substrate having 200–500 die, a stepper process using a 2×2 exposure field pattern (four die per exposure field), there will be between 50–125 exposure fields per substrate. However, a typical metrology sampling plan may involve obtaining metrology data from only one metrology site within each of nine exposure fields on the substrate.

The standard metrology sampling routines applied in modern semiconductor manufacturing are useful, but they do not provide sufficient information in a timely manner to avoid some manufacturing problems. What is desired are methods for acquiring metrology data that will, in some cases, provide more effective and useful data such that yields of acceptable products are increased while reducing rework and the consumption of scarce metrology tools and technicians. Moreover, metrology sampling needs to be more responsive so that problems and variations with tools and/or processes may be more quickly identified and corrected.

The present invention is directed to various methods and systems that may solve, or at least reduce, some or all of the aforementioned problems.

SUMMARY OF THE INVENTION

The present invention is generally directed to various methods of using adaptive sampling techniques based upon categorization of process variations, and a system for performing same. In one illustrative embodiment, the method comprises acquiring metrology data regarding at least one process operation performed on a plurality of substrates in accordance with an initial metrology sampling plan, providing the acquired metrology data to a controller that identifies process variations in the process operation(s) based upon the acquired metrology data and further identifies a plurality of categories of the process variations. The method farther comprises creating, using the controller, a modified metrology sampling plan based upon a relative weighting of the identified categories of the process variations, wherein the modified metrology sampling plan differing from the initial metrology sampling plan in at least one aspect, and acquiring metrology data from at least one subsequently processed wafer in accordance with the modified metrology sampling plan.

In another illustrative embodiment, the method comprises acquiring metrology data regarding at least one process operation performed on a plurality of substrates in accordance with an initial metrology sampling plan, providing the acquired metrology data to a controller that identifies process variations in at least one process operation based upon the acquired metrology data and further identifies a plurality of categories of process variations, creating, using the controller, a modified metrology sampling plan based upon a relative weighting of the identified categories of process variations, wherein the modified metrology sampling plan involves acquiring an enhanced amount of metrology data relevant to one of the identified categories having a higher relative weighting, and acquiring metrology data from at least one subsequently processed wafer in accordance with the modified metrology sampling plan.

BRIEF DESCRIPTION OF THE DRAWINGS

The invention may be understood by reference to the following description taken in conjunction with the accompanying drawings, in which like reference numerals identify like elements, and in which.

Figure 1:
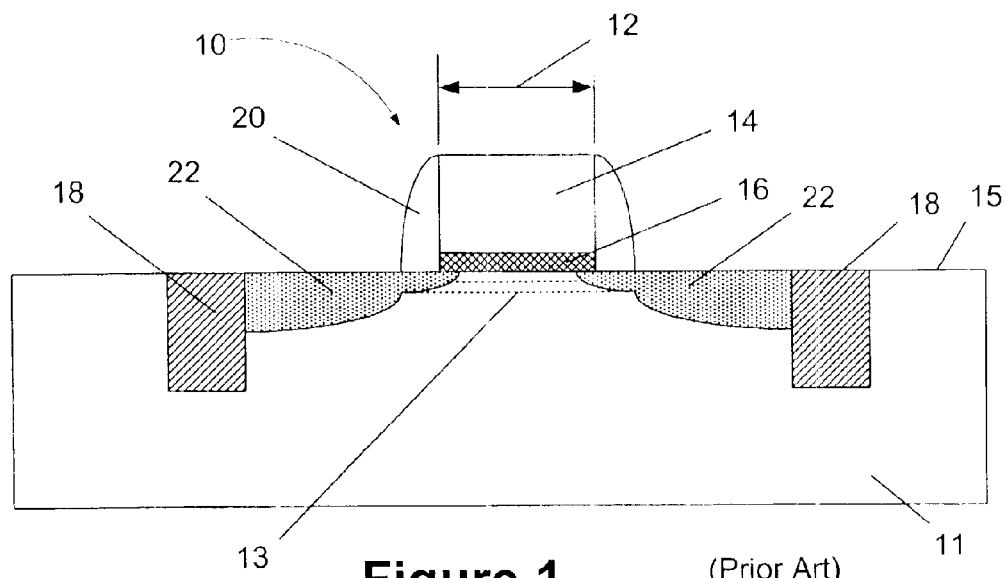
FIG. 1 is a cross-sectional view of an illustrative prior art transistor.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Semiconductor manufacturing generally involves multiple processes whereby multiple layers of material are formed above a semiconducting substrate, and portions of those layers are selectively removed until such time as a completed device is formed. Photolithography is a process typically employed in semiconductor manufacturing. Photolithography generally involves forming a patterned layer of photoresist above one or more layers of material that are desired to be patterned, and using the patterned photoresist layer as a mask in subsequent etching processes. In general, in photolithography operations, the pattern desired to be formed in the underlying layer or layers of material is initially formed on a reticle. Thereafter, using an appropriate stepper tool and known photolithographic techniques, the image on the reticle is transferred to the layer of photoresist. Then, the layer of photoresist is developed so as to leave in place a patterned layer of photoresist substantially corresponding to the pattern on the reticle. This patterned layer of photoresist is then used as a mask in subsequent etching processes, wet or dry, performed on the underlying layer or layers of material, e.g., a layer of polysilicon, metal or insulating material, to transfer the desired pattern to the underlying layer. The patterned layer of photoresist is comprised of a plurality of features, e.g., line-type features or opening-type features, that are to be replicated in an underlying process layer. The features in the patterned layer of photoresist also have a critical dimension, sometimes referred to as a develop inspect critical dimension (DICD).

More particularly, the photolithography process generally involves the steps of: (1) applying a layer of photoresist above a wafer, typically accomplished by a spin-coating process; (2) pre-baking (or soft-baking) the layer of photoresist at a temperature of approximately 90–120° C. to reduce the level of solvents in the layer of photoresist and to improve the adhesion characteristics of the photoresist, (3) performing an exposure process, wherein a pattern is projected onto the layer of photoresist through a reticle used in a stepper tool to create a latent image in the layer of photoresist; (4) performing a post-exposure bake on the layer of photoresist at a temperature approximately 5–15° C. higher than the pre-bake process; (5) performing a develop process to turn the latent image in the layer of photoresist into the final resist image; and (6) performing a post-bake process (or hard-bake) at a temperature of approximately 125–160° C. to remove residual solids, improve adhesion, and to increase the etch resistance of the photoresist. These process steps are well known to those skilled in the art and, thus, will not be described herein in any greater detail.

Figure 2:
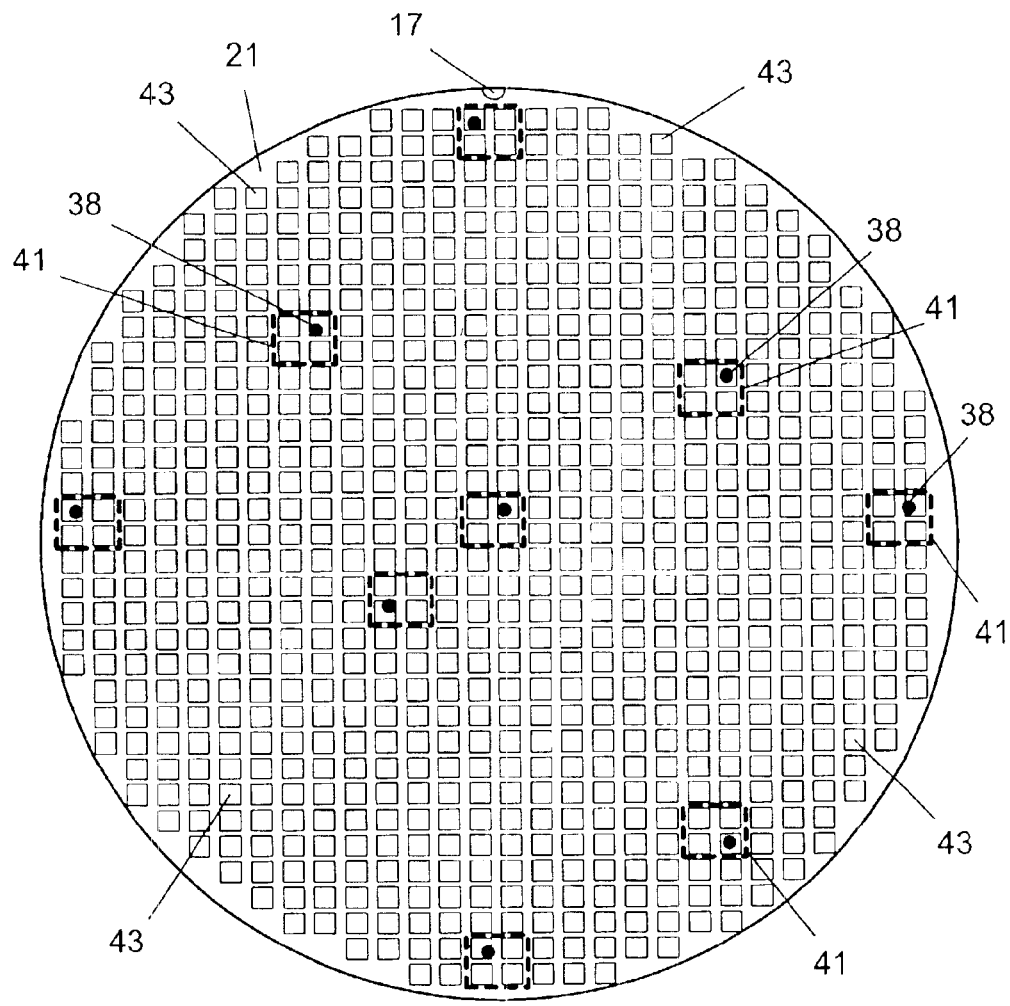
FIG. 2 is a plan view of an illustrative prior art wafer having a plurality of die formed thereabove.

FIG. 2 depicts an illustrative embodiment of a substrate 21 that may be subjected to an exposure process in a stepper tool. As shown therein, a plurality of die 43 are formed above the wafer 21. The die 43 define the area of the wafer 21 where production integrated circuit devices, e.g., microprocessors, ASIC, memory devices, will be formed. The size, shape and number of die 43 per wafer 21 depends upon the type of device under construction. The number of die 43 depicted in FIG. 2 are illustrative in nature. For example, 200–500 hundred die 43 may be formed above an 8-inch diameter wafer 21 depending upon the product being manufactured. The wafer 21 may also have an alignment notch 17 that is used to provide relatively rough alignment of the wafer 21 prior to performing certain processes, e.g., an exposure process in a stepper tool.

The exposure process performed on the wafer 21 is typically performed on a flash-by-flash basis as the wafer 21 is moved, or stepped, relative to the light source (not shown) within the stepper tool. During each step, the light source projects light onto a given area of the wafer 21, i.e., each flash is projected onto an exposure field 41. The exposure field 41 may also be referred to as a flash field. The size of the exposure field 41, as well as the number of die 43 within each exposure field 41, may vary greatly. For example, illustrative exposure fields 41 are depicted in FIG. 2 wherein four of the die 43 fall within each exposure field 41, i.e., a so-called 2×2 pattern. However, the number of die 43 and size of the exposure field 41 may vary. For example, integrated circuits may be exposed using a 1×2 pattern (covering 2 die), a 5×5 pattern (covering 25 die), etc. The precise pattern of the exposure field 41 may be based upon the product under construction as well as the desires and judgment of the appropriate process engineer.

A standard metrology sampling plan with respect to a stepper exposure process may involve obtaining metrology data at one metrology site 38 within each of nine exposure fields 41, as indicated in FIG. 2. The metrology sites 38 depicted in FIG. 2 ac representative ill nature. The actual location of the metrology sites 38 within the exposure fields 41 may vary depending upon the parameter measured and the device under construction. For example, the metrology sites 38 may be located within one of the die 43 or in the scribe lines between the die 43 within the exposure field 41. Typically, the exposure fields 41 selected for metrology measurement are spread across the surface of the substrate 21. Moreover, the feature or characteristic that is measured may be a portion of a production device or part of a test structure.

Figure 3:
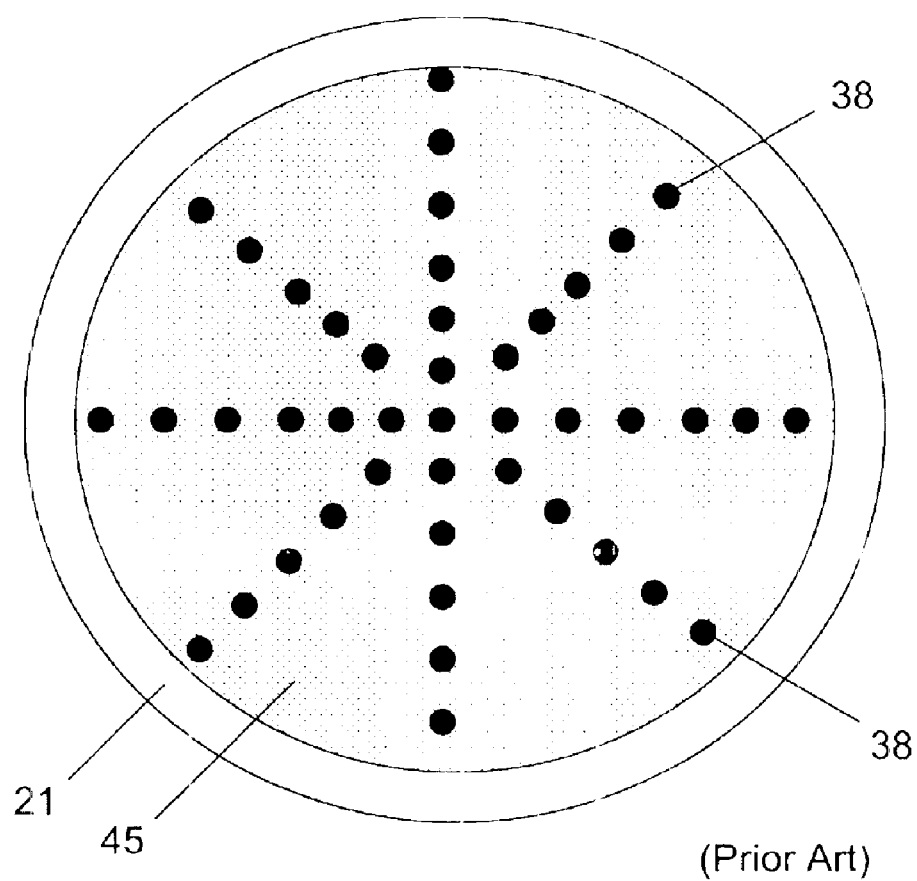
FIG. 3 is a plan view of an illustrative standard metrology sampling plan that may be employed with respect to measuring a thickness of a process layer.

A deposited layer of material 45 may also be subjected to a standard metrology sampling plan wherein the surface of the layer is substantially covered as depicted in FIG. 3. For example, a standard metrology sampling plan may include 49 metrology sites 38 arranged in a pattern comprised of a plurality of concentric circles of ever increasing diameter. FIG. 3 is a schematic depiction of a sampling plan that involves 44 metrology sites 38 wherein, for example, the thickness of the process layer will be measured.

In general, the present invention is directed to various methods of using adaptive sampling techniques based upon categorization of process variations, and a system for performing same. As will be readily apparent to those skilled in the art upon a complete reading of the present application, the present method is applicable to a variety of technologies, e.g., NMOS, PMOS, CMOS, etc., and it is readily applicable to a variety of devices, including, but not limited to, logic devices, memory devices, etc.

Figure 4:
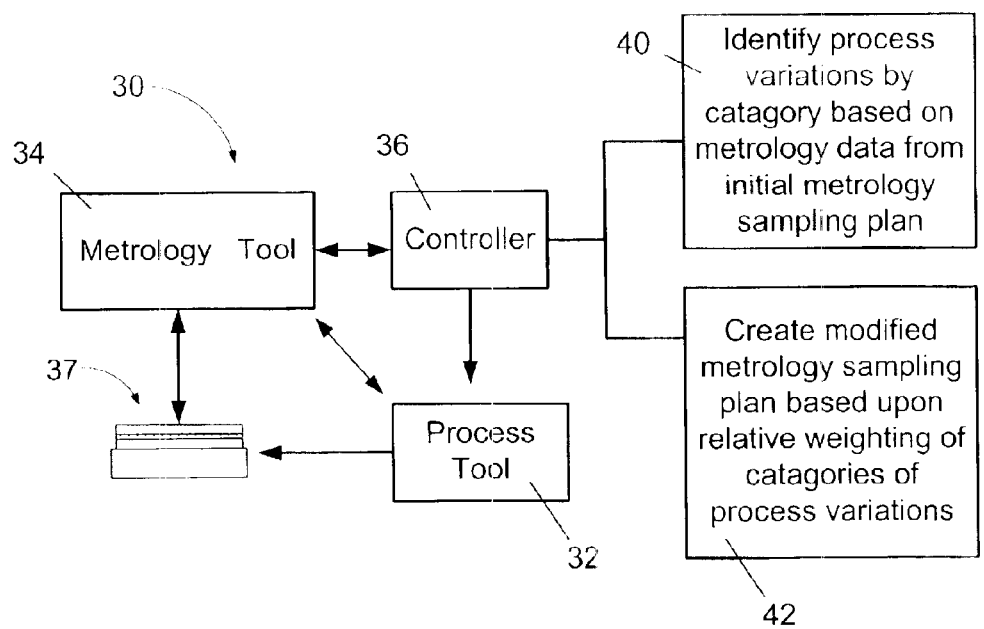
FIG. 4 depicts an illustrative embodiment of a system in accordance with one embodiment of the present invention.

FIG. 4 is a schematic depiction of an illustrative system 30 that may be employed with one or more aspects of the present invention. The illustrative system 30 is generally comprised of a representative process tool 32, a representative metrology tool 34 and a controller 36. Also depicted in FIG. 4 is a representative substrate 37 that has been subjected to a process operation performed in the process tool 32. As will be recognized by those skilled in the art after a complete reading of the present application, the process tool 32 may be any type of tool or chamber used in semiconductor manufacturing operations. For example, the process tool 32 may be a deposition tool, a photolithography truck/stepper, an etch tool, a furnace, an ion implant tool, a rapid thermal anneal tool, a chemical mechanical polishing tool, wet etch tool or sink, a plasma stripper, etc. Moreover, the present invention may be employed in the context of where metrology data is acquired from multiple process tools 32 performing different process operations.

In general, the present invention involves acquiring metrology data regarding one or more process operations performed in one or more process tools 32. Typically, this metrology data will be acquired as part of an initial or standard metrology sampling program established for the particular process(es) or product. The data may be collected on a real-time basis, i.e., as the process operation is being performed, or after the process has been completed. In turn, at least some of this metrology data is provided to the controller 36. The data may be provided to the controller 36 as it is acquired, or the data may be stored in one or more databases (not shown) which may be accessed to obtain the desired metrology data. The controller 36 then examines the acquired data to identify process variations relative to some preselected standard or target value (or range of values). In other cases, the process variations are identified based upon an analysis of the acquired metrology data itself independent of some preselected standard or target value. The variations may include, for example, variations in the thickness of a deposited layer of material, variations in the critical dimension of various features, variations in desired implant regions profile or location, incomplete processing (e.g., incomplete photoresist development), excessive processing (e.g., over-etching), variations in stepper exposure processes, etc.

The identified process variations may then be categorized by the type or nature of the variation, e.g., the identified process variations may be, for example, across-wafer variations, wafer-to-wafer variations, within exposure field variations, lot-to-lot variations, etc. Thus, as indicated at block 40 of FIG. 4, the controller 36 identifies process variations by category based upon the metrology data acquired during the initial, standard metrology sampling plan. Examples of across-wafer process variations include, for example, thickness variations in a process layer, variations in the profile or critical dimension of etched features across a wafer, variations in profiles or critical dimensions of formed photoresist features, and overlay error variations caused by x-scale, y-scale, wafer rotations or orthagonality. Examples of wafer-to-wafer process variations include, but are not limited to, those listed above wherein there is a statistically significant variation in the data from the measured wafer relative to a larger population of such data. Process variations within a stepper exposure field include, but are not limited to, the tilt of the stepper focal plane relative to the surface of the layer of photoresist, critical dimension variations, and overlay variations relating to reticle rotation and magnification.

Thereafter, the controller 36 may then be used to create a modified metrology sampling plan based upon the relative weighting or occurrence of the various categories of process variations, as indicated at block 42 of FIG. 4. That is, the controller 36 may then determine a new, modified metrology sampling plan, e.g., one that is different in some aspect relative to the initial, standard metrology sampling routine previously used. The modified metrology sampling plan may involve acquiring an enhanced amount of metrology data relevant to at least one of the identified categories of process variations living a higher relative weighting or occurrence. For example, if the statistic analysis referenced above indicates that across-wafer process variations have the highest relative weight or occurrence, then the modified metrology sampling plan may involve performing more thickness measurements on subsequently formed process layers at more locations across the surface of the process layer. As a result, an enhanced amount of metrology data is acquired that is relevant to the highest weighted category of process variations. Using this methodology, scarce metrology resources may be focused on the most dominant category of process variations in an attempt to solve or minimize the process variations.

The modified metrology plan may involve, for example, varying the number of metrology sites, e.g., increasing the number of sites, and/or varying the across-substrate pattern of the metrology sites relative to the initial metrology sampling plan. The modified metrology sampling plan may involve increasing the acquisition of metrology data relating to a particular category of process variations while, in some cases, reducing the acquisition of metrology data with respect to other categories of process variations. For example, based upon an analysis of the metrology data acquired in accordance with the initial, standard metrology sampling plan, the modified metrology plan may involve increasing metrology operations directed to acquiring more data that is relevant to across-wafer process variations while reducing the number of metrology operations directed to acquiring data related to, for example, wafer-to-wafer process variations. The metrology tool 34 may also acquire metrology data relating to the state of the process tool 36, i.e., tool state data. Such tool state data may include data relating to focus and exposure conditions on steppers, atmospheric temperature and pressure, temperature or pressure within a chamber, etc.

Aspects of the present invention will now be discussed in the context of various illustrative examples. However, as will be recognized by those skilled in the art after a complete reading of the present application, the present invention should not be considered as limited to the illustrative examples disclosed herein. A typical standard metrology sampling plan may involve obtaining metrology data from a selected number of processed wafer lots, from many wafers within a selected lot, and from many metrology sites on the wafers selected to be measured. Moreover, in some cases, many metrology sites are measured within many exposure fields of a stepper exposure process. As a more specific example, a standard metrology sampling plan may involve acquiring metrology data from four wafers within each of every tenth processed lot. Where thickness measurements are involved, the standard metrology sampling plan may involve measuring the thickness of the process layer at nine metrology sites spread across each of the wafers. With respect to metrology related to an exposure process, the standard metrology sampling plan may involve obtaining metrology data from one metrology site within each of five exposure fields of the stepper exposure process.

Metrology data acquired in accordance with the initial, standard metrology sampling plan may be subjected to known statistical analysis techniques (e.g., ANOVA) to determine the components or categories of various process variations. Based upon such a statistical analysis, it may be determined that the majority of process variations are of a particular type or category. For example, the statistical analysis may indicate that approximately 30% of al process variations are wafer-to-wafer variations, 62% of all variations are across-wafer variations, while only 8% of the identified process variations are within exposure field type variations.

With the types or categories of process variations identified, a modified metrology sampling plan may be created that will be more effective and efficient in providing metrology data that will enable the correct identification and correction of the source of at least the dominant source of the process variations. In one illustrative embodiment, the relative weight between the various identified categories of process variations may be used for creating the modified metrology sampling plan. For example, due to the relatively high percentage (68%) of across-wafer variations in the example described above, the modified metrology sampling plan may be created so as to acquire more metrology data that is relevant to determining the cause of the across-wafer process variations, i.e., the largest component of all of the process variations. The modified metrology sampling plan may involve increasing the number of metrology sites measured on subsequent wafers, e.g., from 9 sites per wafer (in the initial sampling plan) to 18 sites per wafer in the modified metrology sampling plan. Similarly, due to the relatively low occurrence of within exposure field variations (8%), the modified metrology sampling plan may reduce the number of sites within each exposure field that are measured on subsequently processed wafers, e.g., from five metrology sites per field (standard metrology sampling plan) to one site per exposure field (in the modified metrology sampling plan). Due to the relatively low weighting of the wafer-to-wafer variations, the number of wafers measured per lot may also be reduced, e.g., from four (initial metrology sampling plan) to two (modified metrology sampling plan). Of course, other scenarios can be imagined where, based upon the analysis of the metrology data acquired during the original metrology sampling plan, it may be appropriate to increase the number of wafers sampled within a lot (relative to the number sampled in the standard metrology sampling plan) while decreasing the number of metrology sites measured across a wafer (relative to the number of sites measured in the standard metrology sampling plan). Thus, the present invention has broad applicability and it should not be considered as limited to any particular disclosed embodiment.

Through use of the present invention, scarce metrology sources may be conserved. Moreover, through use of the present invention, additional metrology data may be acquired in a manner that provides a greater opportunity for identifying and correcting the causes of the most frequently occurring process variations. In this manner, semiconductor manufacturing operations may be operated more efficiently and economically.

The precise logic employed by the controller 36 will vary depending upon the devices under construction and the desired degree of control. For example, for high-performance microprocessors, the controller 36 may create a modified sampling plan when very minor changes (or changes in rate) in the relative weighting of the identified categories of process variations are identified from the data collected during the standard metrology sampling plan. If the products under construction are less performance sensitive, then the controller 36 may not take action until such time as the relative weighting of one or more of the identified categories of process variations approaches or exceeds an allowable limit.

The modified metrology sampling plan, when invoked, may be employed for a duration to be determined by the controller 36. For example, the controller 36 may direct that the modified metrology sampling plan be employed until such time as sufficient data is collected so that a meaningful analysis of the problems associated with the process operations and/or process tools may be undertaken. Of course, the duration of such modified sampling plan will vary depending upon the process operations, the process tools and/or the nature of the perceived problem. After sufficient data is collected under the modified sampling plan, the controller 36 may direct that the standard sampling protocol be resumed.

Additionally, in addition to acquiring metrology data according to the modified metrology sampling plan, the controller 36 may periodically, e.g., weekly, after a fixed number of lots are processed, etc., direct that metrology data be acquired in accordance with the initial, standard metrology sampling plan. Such a procedure may be employed to insure that a broad-based sampling of metrology data is obtained on a periodic basis to enable evaluation and analysis of a broad range of potential process variations. After data is acquired in accordance with the periodically-performed standard metrology sampling plan, the controller 36 may resume the acquisition of metrology data in accordance with the previously created modified metrology sampling plan, or the controller 36 may create a new or updated modified metrology sampling plan based upon the data acquired during the periodically-performed standard metrology sampling plan using the illustrative statistical analysis techniques described above.

The metrology tool 34 may be any type of metrology tool capable of collecting any type of metrology data. Moreover, it should be understood that the single metrology tool depicted in FIG. 4 is representative in nature. That is, multiple metrology tools of different types may be employed in the context of the present invention to obtain any of the types of metrology data described herein. For example, the metrology tool 34 may be an ellipsometer, a scanning electron microscope, a profilometer, a scatterometry tool, an overlay metrology tool, a defect inspection tool, etc.

As set forth above, the metrology tool 34 may be used to acquire a variety of metrology data, wafer state data (layer thickness, resistivity, etc.) and tool state data. For example, the metrology data described herein may relate to critical dimensions of a feature, a thickness of a process layer, a temperature or pressure of the process operation, a planarity of a process layer, a depth of an implant region, the shape or profile of a patterned feature, electrical characteristics (e.g., resistivity, capacitance), optical characteristics (n and k), film stress, etc.

In the illustrated embodiments, the controller 36 is a computer programmed with software to implement the functions described herein. Moreover, the functions described for the controller 36 may be performed by one or more controllers spread through the system. For example, the controller 36 may be a fab level controller that is used to control processing operations throughout all or a portion of a semiconductor manufacturing facility. Alternatively, the controller 36 may be a lower level computer that controls only portions or cells of the manufacturing facility. Moreover, the controller 36 may be a stand-alone device, or it may reside on the metrology tool 34 or the process tool 32. However, as will be appreciated by those of ordinary skill in the art, a hardware controller (not shown) designed to implement the particular functions may also be used.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be understood, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the controller 36, as described, is the Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699-Provisional Specification for CIM Framework Domain Architecture) and APC (SEMI E930-999-Provisional Specification for CIM Framework Advanced Process Control Component) specifications are publicly available from SEMI.

Figure 5:
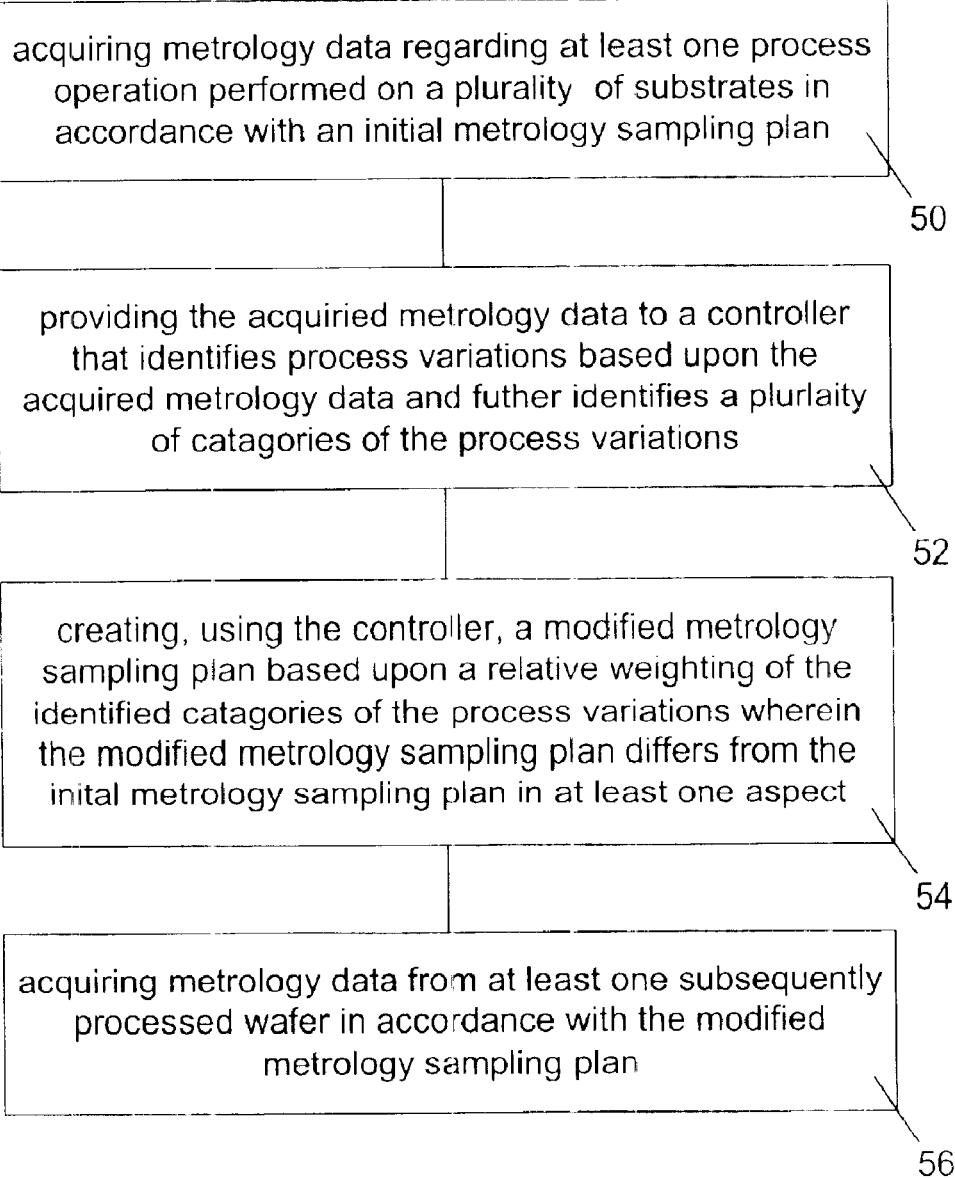
FIG. 5 is a flowchart depicting an illustrative embodiment of the present invention.

The present invention is generally directed to various methods of using adaptive sampling techniques based upon categorization of process variations, and a system for performing same. In one illustrative embodiment, as indicated in FIG. 5, the method comprises acquiring metrology data regarding at least one process operation performed on a plurality of substrates in accordance with an initial metrology sampling plan, as indicated at block 50, and providing the acquired metrology data to a controller that identifies process variations in the process operation(s) based upon the acquired metrology data and further identifies a plurality of categories of the process variations, as set forth at block 52. The method further comprises creating, using the controller, a modified metrology sampling plan based upon a relative weighting of the identified categories of the process variations, wherein the modified metrology sampling plan differs from the initial metrology sampling plan in at least one aspect, as recited at block 54, and acquiring metrology data from at least one subsequently processed wafer in accordance with the modified metrology sampling plan, as indicated at block 56.

In another illustrative embodiment, the method comprises acquiring metrology data regarding at least one process operation performed on a plurality of substrates in accordance with an initial metrology sampling plan, providing the acquired metrology data to a controller that identifies process variations in at least one process operation based upon the acquired metrology data and further identifies a plurality of categories of process variations, creating, using the controller, a modified metrology sampling plan based upon a relative weighting of the identified categories of process variations, wherein the modified metrology sampling plan involves acquiring an enhanced amount of metrology data relevant to one of the identified categories having a higher relative weighting, and acquiring metrology data from at least one subsequently processed wafer in accordance with the modified metrology sampling plan.

Through use of the present invention, better process control may be achieved in modern integrated circuit manufacturing facilities. Additionally, the present invention may enable more precise formation of various features of integrated circuit devices, thereby improving device performance and increasing production yields.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   acquiring metrology data regarding at least one process operation performed on a plurality of substrates in accordance with an initial metrology sampling plan;
   providing said acquired metrology data to a controller that identifies process variations in said at least one process operation based upon said acquired metrology data and further identifies a plurality of categories of said process variations;
   creating, using said controller, a modified metrology sampling plan based upon a relative weighting of said identified categories of said process variations, said modified metrology sampling plan differing from said initial metrology sampling plan in at least one aspect; and
   acquiring metrology data from at least one subsequently processed wafer in accordance with said modified metrology sampling plan.

2. The method of claim 1, wherein said initial metrology sampling plan involves obtaining metrology measurements from at least one of a fixed number of metrology sites across a wafer, a plurality of metrology sites arranged in a specified pattern, a fixed number of metrology sites within an exposure field of a stepper exposure process, and a fixed number of wafers within a lot of said wafers.

3. The method of claim 1, wherein said controller is resident on a stanch alone metrology tool.

4. The method of claim 1, wherein said controller is resident on a process tool adapted to perform said at least one process operation.

5. The method of claim 1, wherein said controller is a stand-alone computer.

6. The method of claim 1, wherein said plurality of categories of said process variations is comprised of at least one of across wafer process variations, wafer-to-wafer Process variations, lot-to-lot process variations and within exposure field process variations.

7. The method of claim 1, wherein said at least one aspect by which said modified metrology sampling plan varies from said initial metrology sampling plan comprises at least one of a number of metrology measurements, a pattern of metrology measurement sites, and a number of wafers measured within a lot of subsequently process wafers.

8. The method of claim 1, wherein said modified metrology sampling plan includes increasing an amount of across-wafer metrology data acquired relative to an amount of across-wafer metrology data acquired bed upon said initial metrology sampling plan due to a higher relative weighting of across-wafer process variations as compared to at least one of wafer-to-wafer process variations and within exposure field process variations determined from said metrology data acquired in accordance with said initial metrology sampling plan.

9. The method of claim 1, wherein said modified metrology sampling plan includes increasing an amount of wafer-to-wafer metrology data acquired relative to an amount of wafer-to-wafer rheology data acquired based upon said initial metrology sampling plan due to a higher relative weighting of wafer-to-wafer process variations as compared to at least one of across-wafer process variations and within exposure field process variations determined from said metrology data acquired in accordance with said initial metrology sampling plan.

10. The method of claim 1, wherein said modified metrology, sampling plan includes increasing an amount of within exposure field metrology data relative to an amount of within exposure field metrology data acquired based upon said initial metrology sampling plan due to a higher relative weighting of with within exposure field process variations as compared to at least one of wafer-to-wafer process variations and across-wafer process variations determined from said metrology data acquired in accordance with said initial metrology sampling plan.

11. The method of claim 1, wherein said at least one process operation is comprised of at least one of a stepper exposure process, a deposition process, an ion implant process, an etching process and a heating process.

12. The method of claim 1, further comprising, after acquiring data in accordance with said modified metrology sampling plan, periodically acquiring additional metrology data in accordance with said initial metrology sampling plan.

13. A method, comprising:
acquiring metrology data regarding at least one process operation performed on a plurality of substrates in accordance with an initial metrology sampling plan;
providing said a metrology data to a controller that identifies process variations in said at least one process operation based upon said acquired metrology data and further identifies a plurality of categories of said process variations;
creating, using said controller, a modified metrology sampling plan based upon a relative weighting of said identified categories of said process variations, said modified metrology sampling plan involving acquiring an enhanced amount of metrology data relevant to one of said identified categories having a higher relative weighting; and
acquiring metrology data from at least one subsequently processed wafer in accordance with said modified metrology sampling plan.

14. The method of claim 13, wherein said initial metrology sampling plan involves obtaining metrology measurements from at least one of a fixed number of metrology sites across a wafer, a plurality of metrology sites arranged in a specified pattern, a fixed number of metrology sites within an exposure field of a stepper exposure process, and a fixed number of wafers within a lot of said wafers.

15. The method of claim 13, wherein said controller is resident on a standalone metrology tool.

16. The method of claim 13, wherein said controller is resident on a process tool adapted to perform said at least one process operation.

17. The method of claim 13, wherein said controller is a stand-alone computer.

18. The method of claim 13, wherein said plurality of categories of said process variations is comprised of at least one of across-wafer process variations, wafer-to-wafer process variations, lot-to-lot process variations and within exposure field process variations.

19. The method of claim 13, wherein said at least one a by which said modified metrology sampling plan varies from said initial metrology sampling plan comprises at least one of a number of metrology measurements, a pattern of metrology measurement sites, and a number of wafers measured within a lot of subsequently process wafers.

20. The method of claim 13, wherein said modified metrology sampling plan involves acquiring an enhanced amount of metrology data relevant to across-wafer process variations.

21. The method of claim 13, wherein said modified metrology sampling plan involves acquiring an enhanced amount of wafer metrology data relevant to wafer-to-wafer process variations.

22. The method of claim 13, wherein said modified metrology sampling plan involves acquiring an enhanced amount of metrology data relevant to within exposure field process variations.

23. The method of claim 13, wherein said at least one process operation is comprised of a least one of a stepper exposure process, a deposition process, an ion implant process, an etching process and a heating process.

24. The method of claim 13, further comprising, after acquiring data in accordance with said modified metrology sampling plan, periodically acquiring additional metrology data in accordance with said initial metrology sampling plan.

* * * * *

UNITED STATES PATENT AND TRADEMARK OFFICE
CERTIFICATE OF CORRECTION

PATENT NO. : 6,859,746 B1
DATED : February 22, 2005
INVENTOR(S) : James Broc Stirton It is certified that error appears in the above-identified patent and that said Letters Patent is hereby corrected as shown below:

Column 12,
Line 57, delete "stanch" and insert -- stand --.

Column 13,
Line 10, delete "bed" and insert -- based --.
Line 20, delete "rheology" and insert -- metrology --.
Line 32, delete "with within" and insert -- within --.

Column 14,
Line 29, delete "one a" and insert -- a --.

Signed and Sealed this

Twenty-fourth Day of May, 2005

JON W. DUDAS
*Director of the United States Patent and Trademark Office*